United States Patent
Lin et al.

(10) Patent No.: US 9,704,783 B2
(45) Date of Patent: Jul. 11, 2017

(54) THROUGH SUBSTRATE VIAS WITH IMPROVED CONNECTIONS

(71) Applicant: Taiwan Semiconductor Manufacturing Company, Ltd., Hsin-Chu (TW)

(72) Inventors: Jing-Cheng Lin, Hsin-Chu (TW); Ku-Feng Yang, Baoshan Township (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 29 days.

(21) Appl. No.: 15/056,935

(22) Filed: Feb. 29, 2016

(65) Prior Publication Data
US 2016/0181179 A1  Jun. 23, 2016

Related U.S. Application Data

(63) Continuation of application No. 12/769,251, filed on Apr. 28, 2010, now Pat. No. 9,293,366.

(51) Int. Cl.
*H01L 23/48* (2006.01)
*H01L 21/768* (2006.01)
(Continued)

(52) U.S. Cl.
CPC ...... *H01L 23/481* (2013.01); *H01L 21/76816* (2013.01); *H01L 21/76879* (2013.01); *H01L 21/76898* (2013.01); *H01L 23/49827* (2013.01); *H01L 23/5226* (2013.01); *H01L 24/05* (2013.01); *H01L 24/13* (2013.01); *H01L 24/14* (2013.01); *H01L 2224/0401* (2013.01); *H01L 2224/05572* (2013.01); *H01L 2224/13025* (2013.01); *H01L 2224/13144* (2013.01); *H01L 2224/13147* (2013.01); *H01L 2224/13155* (2013.01); *H01L 2224/14181* (2013.01); *H01L 2224/73204* (2013.01); *H01L 2924/0002* (2013.01); *H01L 2924/01019* (2013.01); *H01L 2924/10253* (2013.01);
(Continued)

(58) Field of Classification Search
CPC ............ H01L 21/743; H01L 21/76829; H01L 21/76898; H01L 23/481; H01L 23/5226; H01L 23/53223; H01L 21/6835
See application file for complete search history.

(56) References Cited

U.S. PATENT DOCUMENTS 5,391,917 A   2/1995 Gilmour et al.
5,510,298 A   4/1996 Redwine
(Continued)

*Primary Examiner* — Jerome Jackson, Jr.
*Assistant Examiner* — Fang-Xing Jiang
(74) *Attorney, Agent, or Firm* — Slater Matsil, LLP

(57) ABSTRACT

A device includes a substrate, and a plurality of dielectric layers over the substrate. A plurality of metallization layers is formed in the plurality of dielectric layers, wherein at least one of the plurality of metallization layers comprises a metal pad. A through-substrate via (TSV) extends from the top level of the plurality of the dielectric layers to a bottom surface of the substrate. A deep conductive via extends from the top level of the plurality of dielectric layers to land on the metal pad. A metal line is formed over the top level of the plurality of dielectric layers and interconnecting the TSV and the deep conductive via.

20 Claims, 11 Drawing Sheets

(51) Int. Cl.
   *H01L 23/498* (2006.01)
   *H01L 23/522* (2006.01)
   *H01L 23/00* (2006.01)

(52) U.S. Cl.
   CPC .............. *H01L 2924/10271* (2013.01); *H01L 2924/10329* (2013.01); *H01L 2924/14* (2013.01)

(56) References Cited

U.S. PATENT DOCUMENTS

| | | | |
|---|---|---|---|
| 5,760,429 A * | 6/1998 | Yano | H01L 23/5226 257/211 |
| 5,767,001 A | 6/1998 | Bertagnolli et al. | |
| 5,998,292 A | 12/1999 | Black et al. | |
| 6,184,060 B1 | 2/2001 | Siniaguine et al. | |
| 6,322,903 B1 | 11/2001 | Siniaguine et al. | |
| 6,448,168 B1 | 9/2002 | Rao et al. | |
| 6,465,892 B1 | 10/2002 | Suga | |
| 6,472,293 B1 | 10/2002 | Suga | |
| 6,538,333 B2 | 3/2003 | Kong | |
| 6,599,778 B2 | 7/2003 | Pogge et al. | |
| 6,639,303 B2 | 10/2003 | Siniaguine | |
| 6,664,129 B2 | 12/2003 | Siniaguine | |
| 6,693,361 B1 | 2/2004 | Siniaguine et al. | |
| 6,740,582 B2 | 5/2004 | Siniaguine | |
| 6,800,930 B2 | 10/2004 | Jackson et al. | |
| 6,841,883 B1 | 1/2005 | Farnworth et al. | |
| 6,882,030 B2 | 4/2005 | Siniaguine | |
| 6,924,551 B2 | 8/2005 | Rumer et al. | |
| 6,962,867 B2 | 11/2005 | Jackson et al. | |
| 6,962,872 B2 | 11/2005 | Chudzik et al. | |
| 6,984,892 B2 | 1/2006 | Gotkis et al. | |
| 7,030,481 B2 | 4/2006 | Chudzik et al. | |
| 7,049,170 B2 | 5/2006 | Savastiouk et al. | |
| 7,060,601 B2 | 6/2006 | Savastiouk et al. | |
| 7,071,546 B2 | 7/2006 | Fey et al. | |
| 7,111,149 B2 | 9/2006 | Eilert | |
| 7,122,902 B2 * | 10/2006 | Hatano | H01L 23/53223 257/758 |
| 7,122,912 B2 | 10/2006 | Matsui | |
| 7,157,787 B2 | 1/2007 | Kim et al. | |
| 7,193,308 B2 | 3/2007 | Matsui | |
| 7,262,495 B2 | 8/2007 | Chen et al. | |
| 7,297,574 B2 | 11/2007 | Thomas et al. | |
| 7,335,972 B2 | 2/2008 | Chanchani | |
| 7,354,798 B2 | 4/2008 | Pogge et al. | |
| 7,355,273 B2 | 4/2008 | Jackson et al. | |
| 7,608,538 B2 | 10/2009 | Deligianni et al. | |
| 2002/0081838 A1 | 6/2002 | Bohr | |
| 2004/0101663 A1 * | 5/2004 | Agarwala | H01L 21/76829 428/209 |
| 2007/0090490 A1 * | 4/2007 | Chang | H01L 23/481 257/621 |
| 2007/0166997 A1 * | 7/2007 | Knorr | H01L 21/76898 438/622 |
| 2008/0079461 A1 | 4/2008 | Lin et al. | |
| 2008/0283959 A1 | 11/2008 | Chen et al. | |
| 2008/0303154 A1 | 12/2008 | Huang et al. | |
| 2009/0014888 A1 | 1/2009 | Lee et al. | |
| 2009/0102021 A1 | 4/2009 | Chen et al. | |
| 2009/0160051 A1 * | 6/2009 | Lee | H01L 21/76898 257/737 |
| 2009/0160058 A1 | 6/2009 | Kuo et al. | |
| 2009/0315154 A1 * | 12/2009 | Kirby | H01L 21/743 257/621 |
| 2010/0084747 A1 * | 4/2010 | Chen | H01L 21/6835 257/621 |
| 2010/0187671 A1 | 7/2010 | Lin et al. | |

\* cited by examiner

THROUGH SUBSTRATE VIAS WITH IMPROVED CONNECTIONS

PRIORITY CLAIM

This application claims the benefit to and is a continuation of U.S. patent application Ser. No. 12/769,251, filed on Apr. 28, 2010 and entitled "Through-Substrate Vias with Improved Connections" which application is incorporated herein by reference.

TECHNICAL FIELD

This disclosure relates generally to integrated circuit structures, and more particularly to forming through-substrate vias with improved electrical connections.

BACKGROUND

Among the efforts for reducing the size of integrated circuits and reducing RC delay, three-dimensional integrated circuit (3DIC) and stacked dies are commonly used. Through-substrate vias (TSVs) are thus used in 3DIC and stacked dies. In this case, TSVs are often used to connect the integrated circuits on a die to the backside of the die. In addition, TSVs are also used to provide short grounding paths for grounding the integrated circuits through the backside of the die, which may be covered by a grounded metallic film.

There are two commonly used approaches for forming TSVs, via-first approach and via-last approach. When formed using the via-first approach, vias are formed before the back-end-of-line (BEOL) processes are performed. Accordingly, the TSVs are formed before the formation of metallization layers. Due to the thermal budget in the BEOL processes, however, the TSVs formed using the via-first approach suffer from problems such as copper popping and metal-1 to metal-2 bridging.

On the other hand, the via-last approach, although being cost effective and having a short time-to-market, the resulting structures are less efficient in power connection. For example, FIGS. 1 and 2 illustrate two interconnect structures comprising via-last TSVs. In FIG. 1, die 4 is bonded to die 2 through a face-to-face bonding. In FIG. 2, die 4 is bonded to die 2 through a face-to-back bonding. TSVs 6 are formed in dies 2, and are used for connecting power to the devices in dies 2. It is observed that regardless whether the power is introduced into die 2 from bump 12 as in FIG. 1, or introduced into die 2 from die 4 as in FIG. 2, the connection of the power to device 8 in dies 4 have long paths, as illustrated by arrows 14. Further, each of the long power paths 14 includes a plurality of metal lines and vias. Accordingly, the resistances of the power paths are also high.

SUMMARY

In accordance with one aspect, a device includes a substrate, and an interconnect structure over the substrate. The interconnect structure includes a plurality of metallization layers including a bottom metallization layer (M1) and a top metallization layer (Mtop). A dielectric layer is over the Mtop. A through-substrate via (TSV) is formed to extend from a top surface of the dielectric layer to a bottom surface of the substrate. A deep conductive via is formed to extend from the top surface of the dielectric layer to land on a metal pad in one of the plurality of metallization layers. A metal line is over the dielectric layer and interconnects the TSV and the deep conductive via.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel method for forming through-silicon vias (TSVs, also sometimes known as through-silicon vias when they are formed in a silicon substrate) is provided. The intermediate stages of manufacturing an embodiment are illustrated. The variations of the embodiment are then discussed. Throughout the various views and illustrative embodiments, like reference numbers are used to designate like elements.

Figure 1:
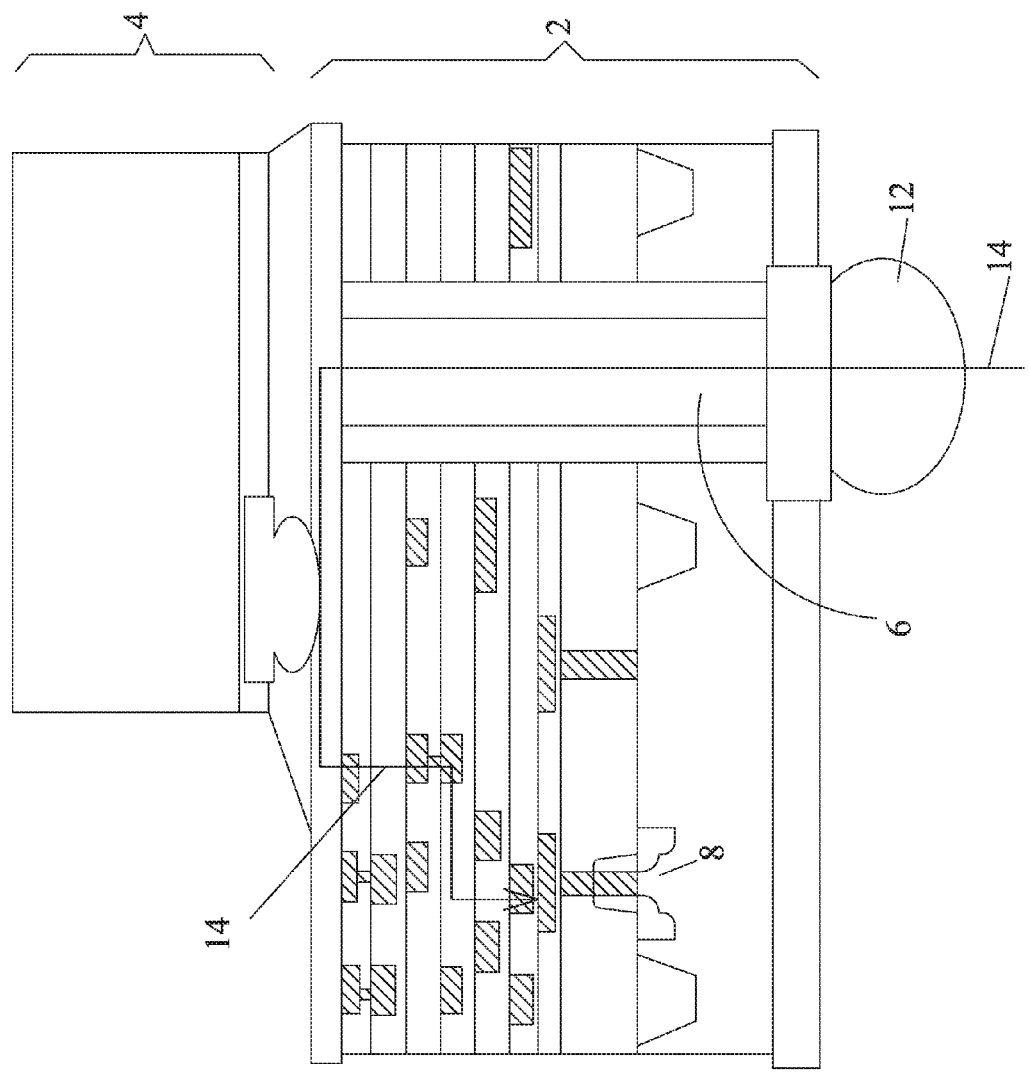
FIGS. 1 and 2 illustrate conventional connections of power into dies through through-substrate vias (TSVs)
Figure 2:
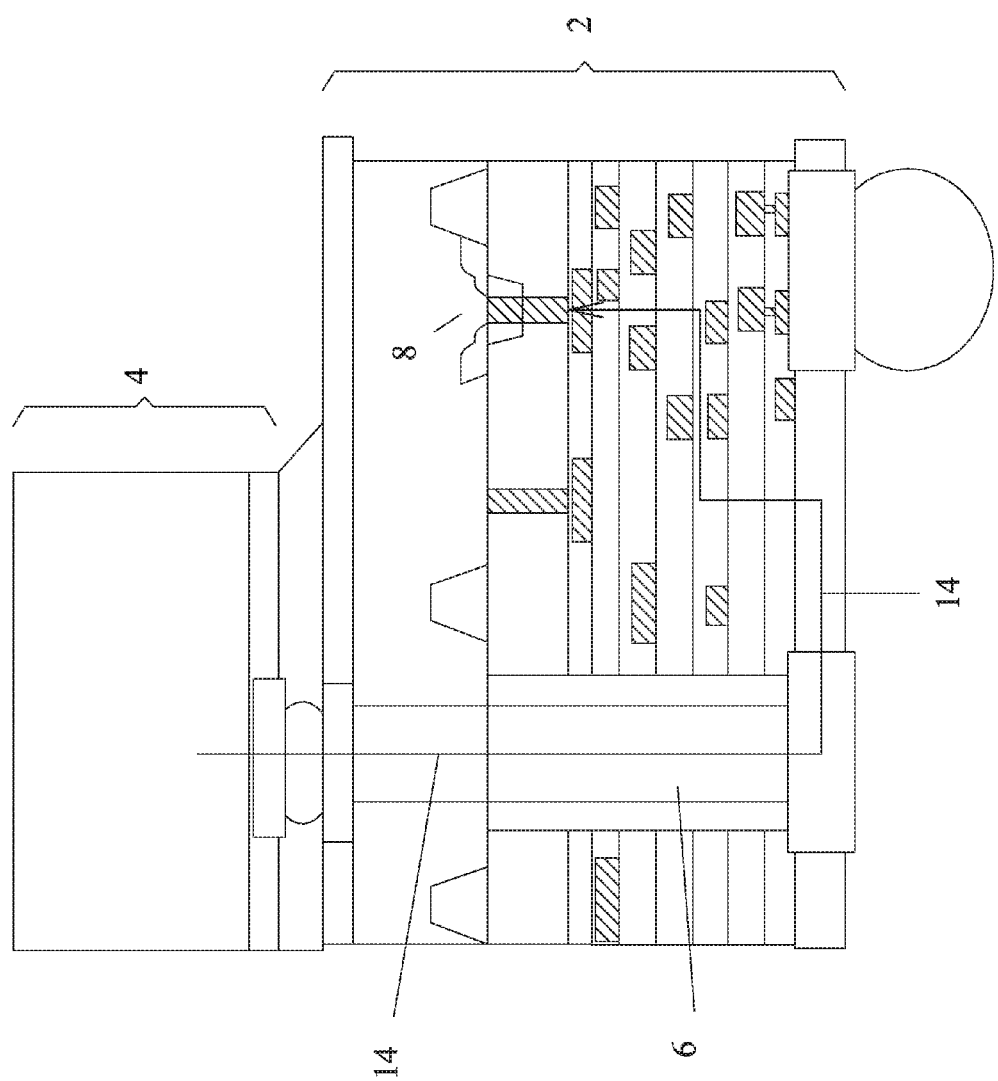
Figure 3:
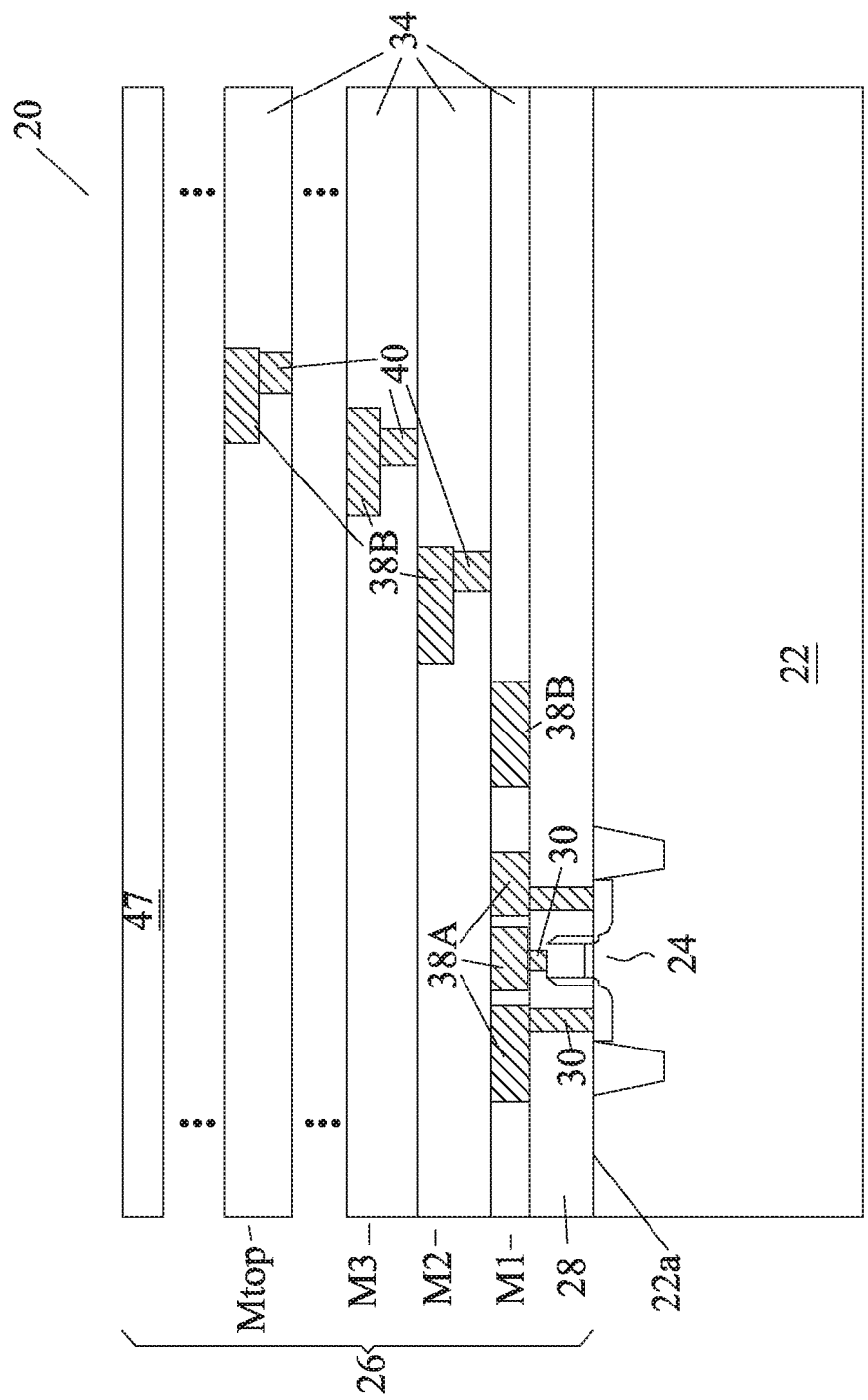
FIGS. 3 through 9 are cross-sectional views of intermediate stages in the manufacturing of a wafer comprising a TSV and deep conductive vias connected to the TSV in accordance with various embodiments.

Referring to FIG. 3, wafer 20, which includes substrate 22 and integrated circuits 24 (symbolized by a transistor) therein, is provided. In accordance with various embodiments, wafer 20 is a device wafer comprising active integrated circuit devices such as transistors. Substrate 22 may be a semiconductor substrate, such as a bulk silicon substrate, although it may be formed of other semiconductor materials such as silicon germanium, gallium arsenide, and/or the like. Semiconductor devices such as transistors (a symbolized by transistor 24) may be formed at the front surface 22a of substrate 22. Interconnect structure 26 is formed on the front side of substrate 22. Interconnect structure 26 may include inter-layer dielectric (ILD) 28 (in which the electrodes of transistor is located) and contact plugs 30 in ILD 28, wherein contact plugs 30 may be formed of tungsten or other metallic materials.

Furthermore, interconnect structure 26 include inter-metal dielectrics (IMDs) 34, and metal lines/pads 38 (including 38A and 38B) and vias 40 in IMDs 34. IMDs 34 may be formed of low-k dielectric materials having low k values, for example, lower than about 2.5, or even lower than about 2.0. Interconnect structure 26 may include a bottom metallization layer (commonly known as M1) and a top metallization layer (commonly known as Mtop), and a plurality of metallization layers therebetween, including the metallization layer (M2) immediately over M1, the metallization layer (M3) immediately over M2, and the like. The metal features in interconnect structure 26 may be electrically coupled to semiconductor devices 24. Metal lines/pad 38 and vias 40 may be formed of copper or copper alloys, and may be formed using the well-known damascene processes. Metal lines/pads 38 include metal lines 38A and metal pads 38B, with metal pads 38B being used for landing the subsequently formed deep vias.

Interconnect structure 26 may further include one or more passivation layer(s) 47 that is immediately over metallization layer Mtop. Passivation layer 47 may be a non-low-k dielectric layer, and may be formed of silicon oxide, silicon nitride, un-doped silicate glass, polyimide, or the like. Further, additional metal lines/pads and vias (not shown) may be formed in passivation layer(s) 47.

Figure 11:
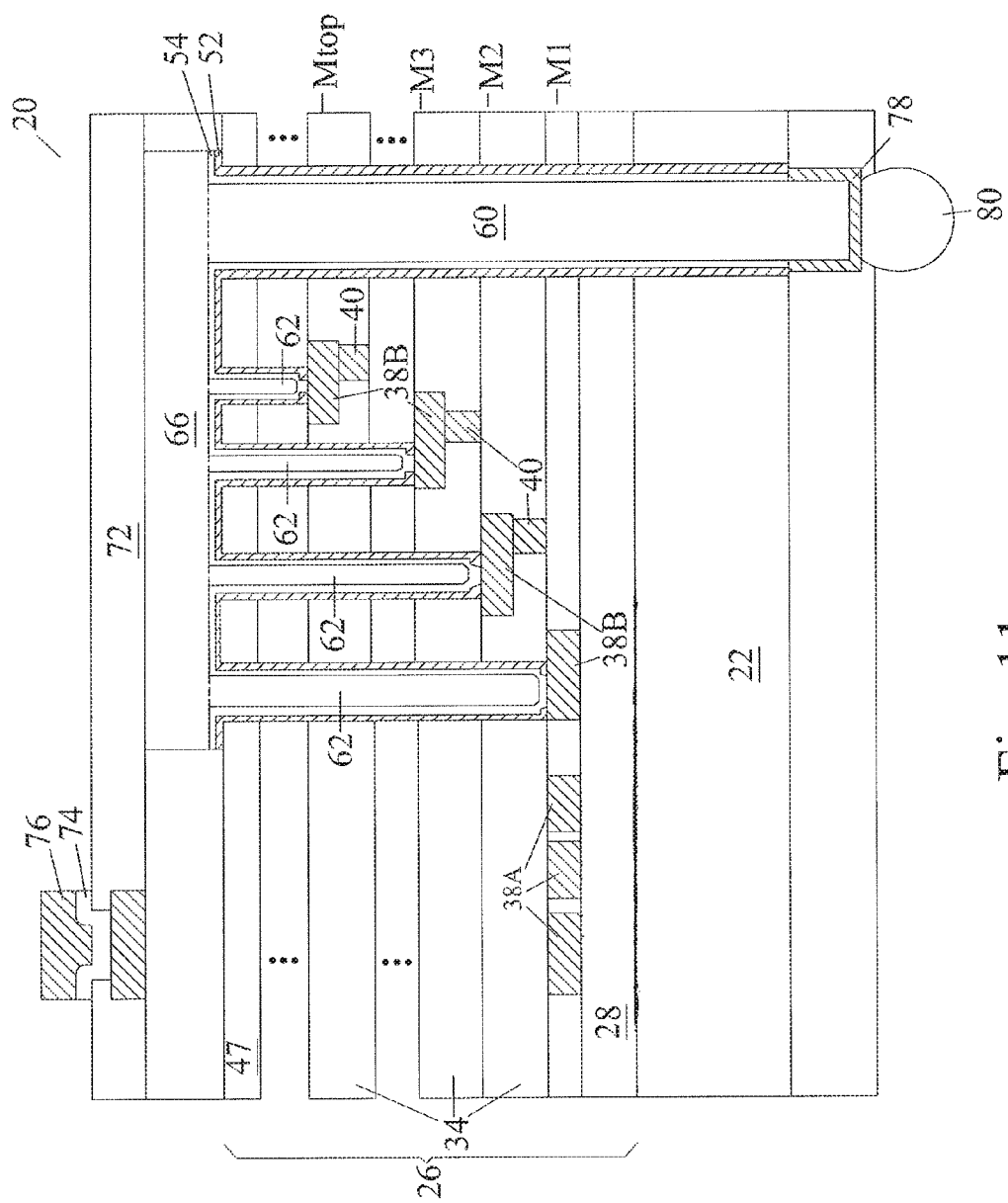
FIG. 11 illustrates a wafer comprising a TSV and deep conductive vias, wherein the TSV extends through a substrate that is substantially free from an integrated circuit device.

In alternative embodiments, such as in the example of FIG. 11, wafer 20 is an interposer wafer, and is substantially free from integrated circuit devices, including active devices such as transistors and diodes formed therein. In these embodiments, substrate 22 may be formed of a semiconductor material or a dielectric material. The dielectric material may be silicon oxide, an organic material such as polyimide, a hybrid material such as molding compound, glass, or the like. Furthermore, interposer wafer 20 may include, or may be free from, passive devices such as capacitors, resistors, inductors, varactors, and/or the like.

Figure 4:
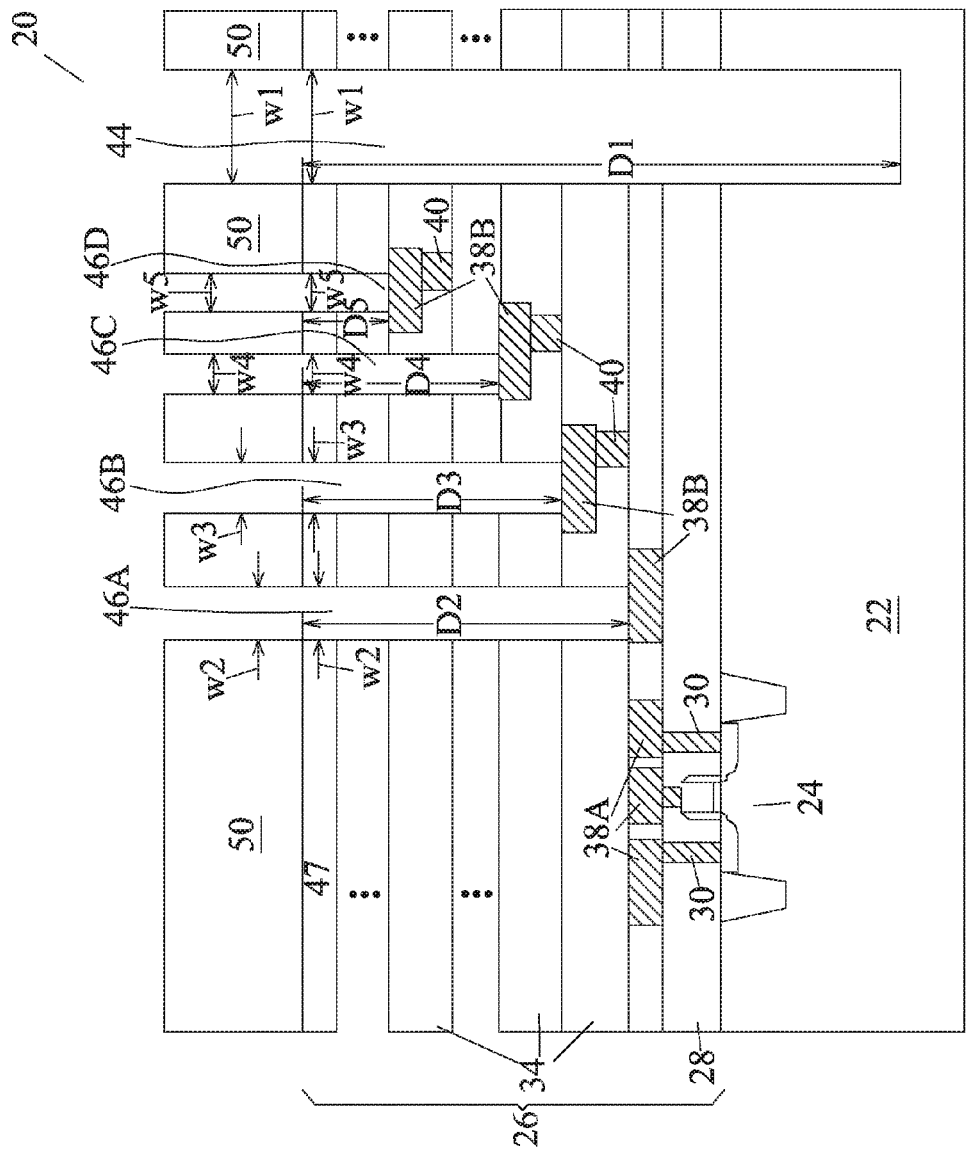

Referring to FIG. 4, after the formation of interconnect structure 26, which may or may not include layer(s) 47, TSV opening 44 and deep via openings 46 (including 46A, 46B, 46C, 46D, and possibly more that are not illustrated) are formed. In an embodiment, photo resist 50 is formed and patterned. TSV opening 44 and deep via openings 46 are then formed simultaneously by etching. TSV opening 44 extends into substrate 22, while deep via openings 46 stop at respective metal pads 38B, with metal pads 38B exposed through deep vias 46. Further, the formation of deep via openings 46 may stop at metal pads 38B in any one of different metallization layers ranging from M1 through Mtop in any desirable combination.

In an embodiment, pattern loading effect is used to form TSV opening 44 and deep vias openings 46, which have different depths, simultaneously. It is observed that when certain via openings are formed, the via openings having greater horizontal sizes may have greater depths than the via openings having smaller sizes, even if they are formed by a same etching process. As a result of the pattern loading effect in the etching process, and also due to the size difference between TSV opening 44 and deep via openings 46, the resulting TSV opening 44 and deep via openings 46 will have different depths. With properly adjusted horizontal sizes W1 through W5, when the desirable depth D1 of TSV opening 44 is reached, desirable depths D2, D3, D4, D5, and the like are also reached. This may reduce the undesirable over-etching of metal pads 38B, and hence the undesirable damage to metal pads 38B may be minimized. Accordingly, the horizontal dimension W1 (which may be a diameter or a length/width, depending on the shape of TSV opening 44) of TSV opening 44 is greater than horizontal dimensions W2, W3, W4, and W5 of deep via openings 46. In an embodiment, a ratio of W1/W2 (or W1/W3, W1/W4, and so on) may be greater than about 1.5, greater than about 5, or even greater than about 100. Further, depth D1 of TSV opening 44 is greater than depth D2 of deep via openings 46. In an embodiment, a ratio of D1/D2 (or D1/D3, D1/D4, and so on) may be greater than about 5, or even greater than about 5,000. Further, in the illustrated embodiments, W2 may be greater than W3 with ratio W2/W3 being greater than about 1.2, W3 may be greater than W4 with ratio W3/W4 being greater than about 1.2, and W4 may be greater than W5 with ratio W4/W5 being greater than about 1.2.

Figure 5:
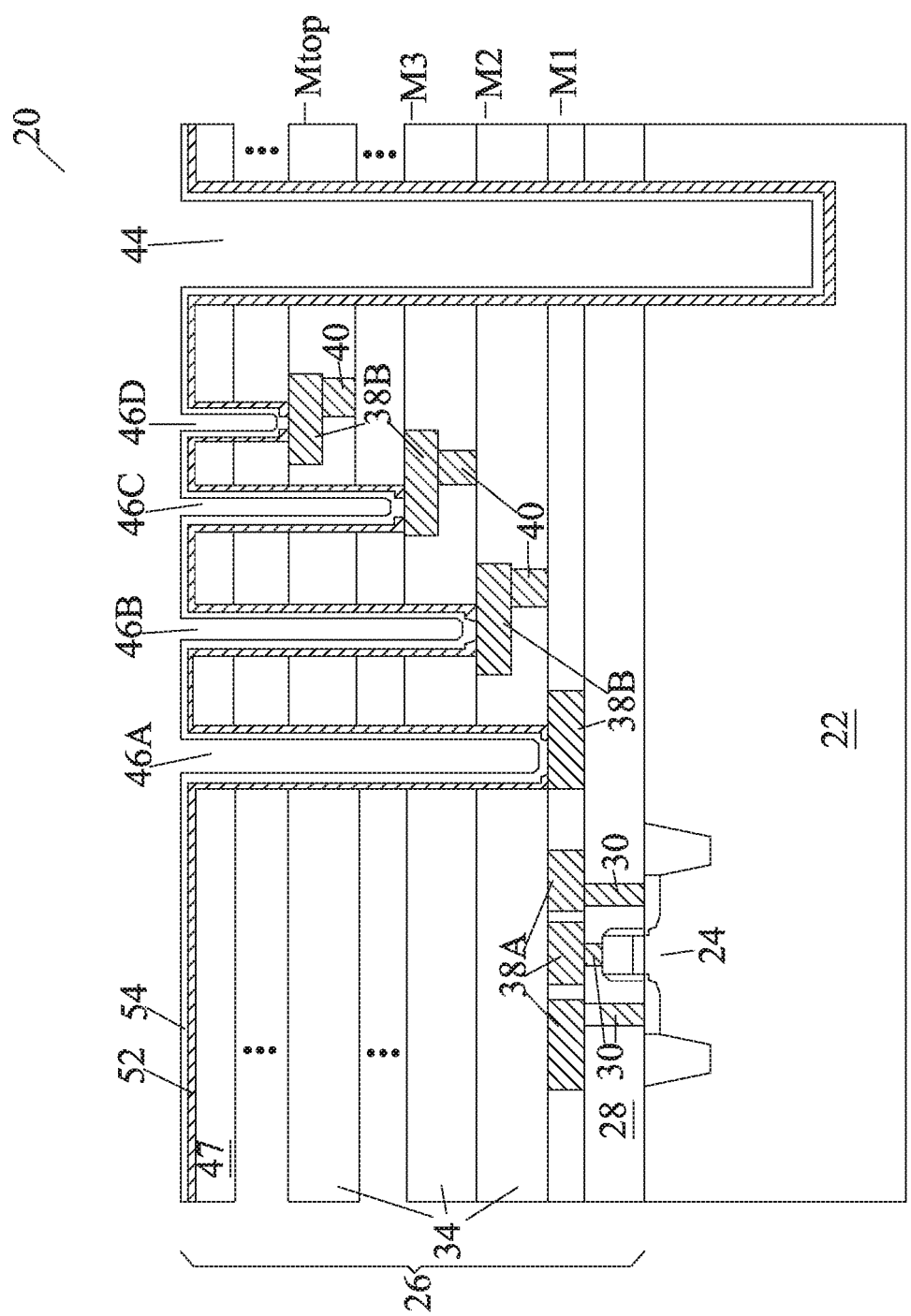

Referring to FIG. 5, insulation layer 52 is formed and patterned, and metal pads 38B are exposed through the openings in insulation layer 52. Next, diffusion barrier layer 54, also referred to as a glue layer, is blanket formed, covering the sidewalls and the bottom of TSV opening 44. Diffusion barrier layer 54 may include commonly used barrier materials such as titanium, titanium nitride, tantalum, tantalum nitride, and combinations thereof, and can be formed using physical vapor deposition, for example. Next, a thin seed layer (not shown) may be blanket formed on diffusion barrier layer 54. The materials of the seed layer may include copper or copper alloys, and metals such as silver, gold, aluminum, and combinations thereof may also be included. In an embodiment, the seed layer is formed of sputtering. In other embodiments, other commonly used methods such as electro or electroless plating may be used.

Figure 6:
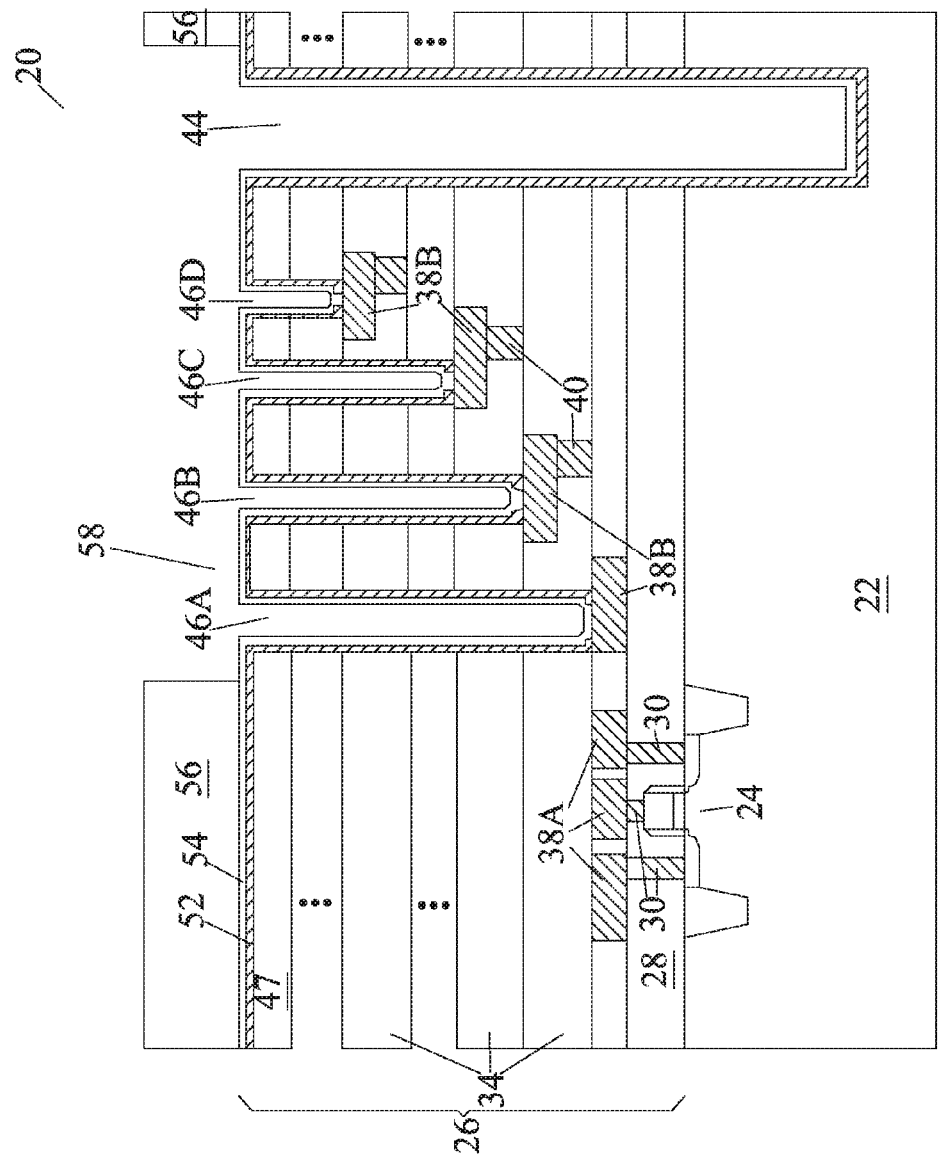

Referring to FIG. 6, mask 56 is formed on the previously formed structure. In an embodiment, mask 56 comprises a photo resist, for example. Mask 56 is then patterned. In an exemplary embodiment, the resulting TSV needs to be connected to metal pads 38B. Accordingly, opening 58 is formed in mask 56, exposing TSV opening 44 and deep via openings 46.

Figure 7:
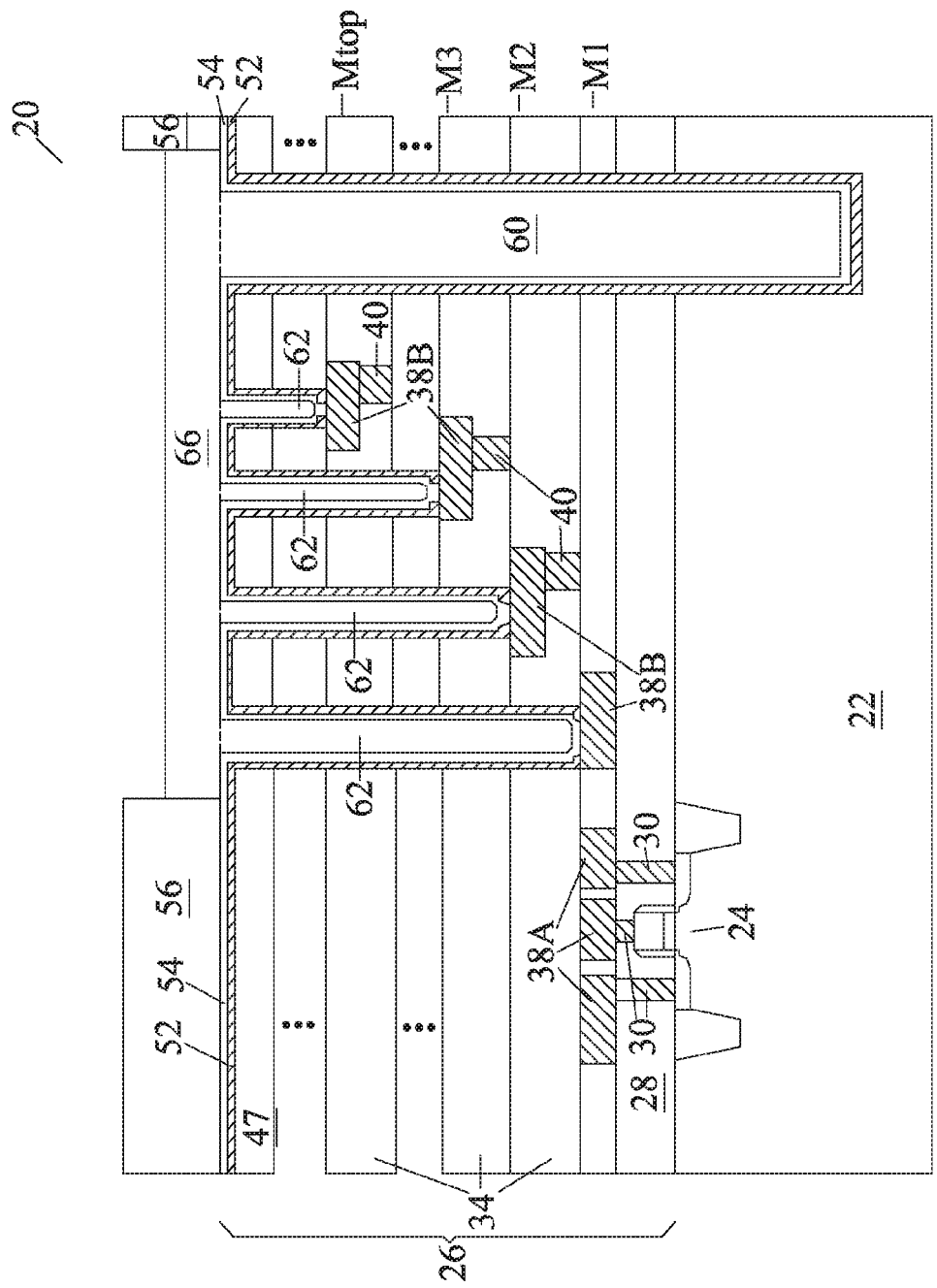

In FIG. 7, a metallic material is filled into openings 44, 46, and 58, forming TSV 60 in TSV opening 44, deep conductive vias 62 in deep via openings 46, and metal line 66 in the opening 58. In various embodiments, the filling material includes copper or copper alloys, although other metals, such as aluminum, silver, gold, and combinations thereof, may also be used. The formation methods may include printing, electro plating, electroless plating, and the like. In the same deposition process in which TSV opening 44 is filled with the metallic material, the same metallic material may also be filled in opening 58, forming metal line 66, which is also referred to a redistribution line.

Figure 8:
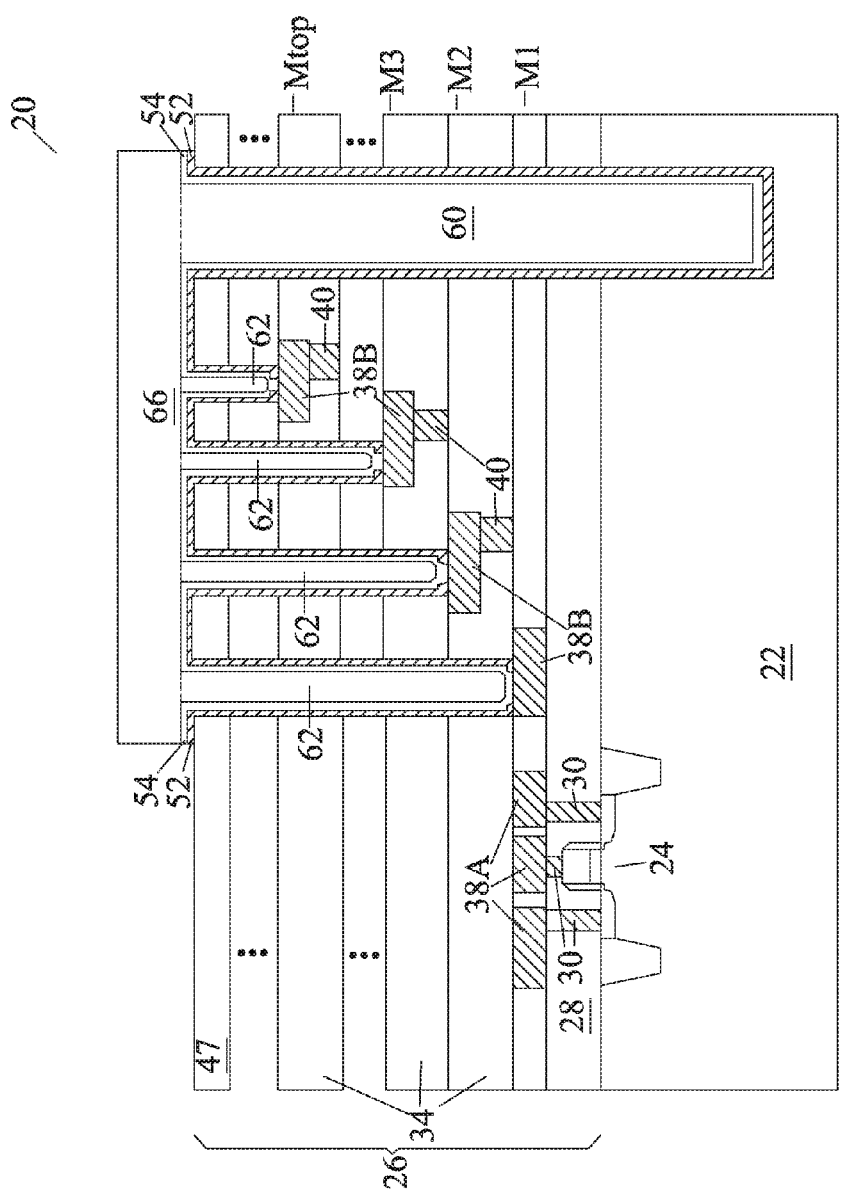
Figure 9:
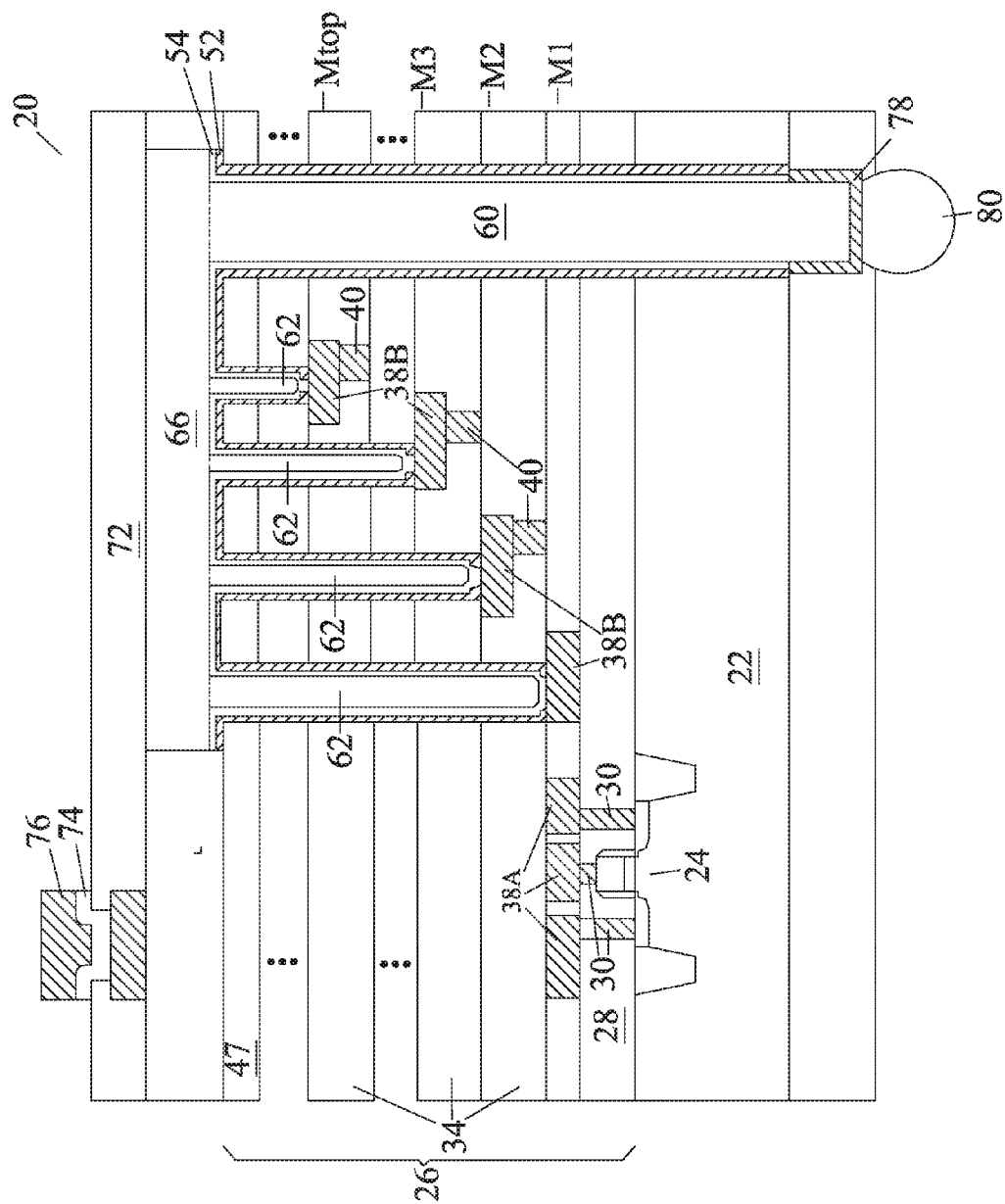

Next, as is shown in FIG. 8, mask 56 is removed. Passivation layer(s) 72 and Under-bump metallurgy (UBM) 74 may then be formed, as shown in FIG. 9. Metal bump 76 is also formed. Metal bump 76 may be a solder bump, a copper bump, and may include other layers/materials such as nickel, gold, solder, and/or the like.

After the formation of Metal bump 76, the backside of wafer 20 may be grinded, so that TSV 60 is exposed. A backside interconnect structure, which may include UBM 78 and bond pad/metal bump 80, is then formed on the backside of wafer 20. Further, a backside interconnect structure (not shown) including a plurality of redistribution layers may be formed between, and electrically coupling, TSV 60 and metal bump 80.

Figure 10:
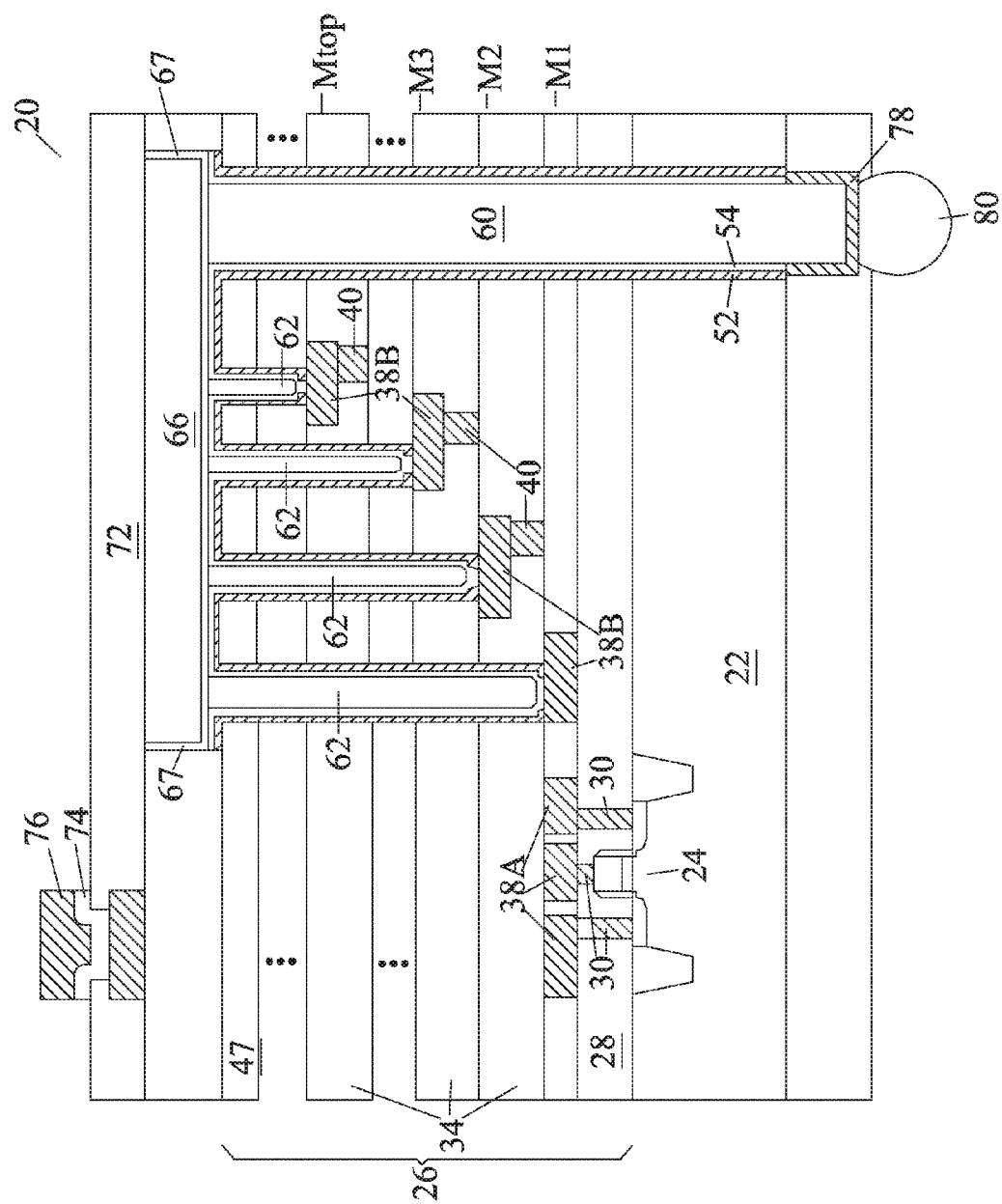
FIG. 10 illustrates a wafer comprising a TSV and deep conductive vias, wherein a metal line connecting the TSV and the deep conductive vias is formed in a process step separated from the process step for forming the TSV and the deep conductive via.

FIG. 10 illustrates an alternative embodiment. This embodiment is essentially the same as the embodiment shown in FIG. 9, except that metal line 66 is not formed in the same process as forming TSV 60 and deep vias 62. In the respect formation process, after the formation of the structure shown in FIG. 5, TSV opening 44 and deep via openings 46 are filled, followed by a planarization process such as a chemical mechanical polish (CMP) to remove excess metal, and hence TSV 60 and deep vias 62 are formed. However, after the CMP, TSV 60 and deep vias 62 are electrically disconnected from each other. Next, metal line 66 is formed to electrically couple TSV 60 to deep vias 62. In the resulting structure, diffusion barrier layer 67 separates TSV 60 and deep vias 62 from metal line 66. Diffusion barrier layer 67 may comprise titanium, titanium nitride, tantalum, tantalum nitride, or the like. In the structure shown in FIG. 9, however, no diffusion barrier layer is formed to separate TSV 60 and deep vias 62 from metal line 66.

Although in the illustrated figures, device dies including semiconductor devices are used as examples, the teaching provided by the embodiments may be readily applied to interposers comprising no integrated circuits such as transistors, resistors, diodes, capacitors, and/or the like. Similarly, by using the embodiments, deep vias can be formed on interconnect structures on either one, or both, of the frontside interconnect structure and backside interconnect structure, with the deep vias connected to TSVs in interposers.

In the embodiments, with the formation of deep vias 62, the power (or signal) introduced to TSV 60 may be provided to metal pads 38B through deep vias 62 that have different lengths. Compared to conventional via-last structures, the paths to metal features that are on different metallization layers are significantly shortened. As a result, the power connection efficiency is improved.

In some aspects, embodiments described herein provide for a method of manufacturing a device that includes etching a first opening in a dielectric structure, the dielectric structure comprising a plurality of metallization layers formed in a plurality of respective dielectric layers, wherein the first opening exposes a metal pad disposed in at least one of the plurality of dielectric layers. The method also includes etching a second opening through the dielectric structure and into a portion of a substrate disposed below the dielectric structure, wherein the etching the first opening and the etching the second opening occur simultaneously, and simultaneously filling the first opening and the second opening with a conductive material.

In other aspects, embodiments described herein provide for a method of manufacturing a device including forming a interconnect structure over a substrate, the interconnect structure including a plurality of conductive pads formed in respective dielectric layers of a plurality of dielectric layers. The method also includes etching a first opening aligned with a first conductive pad, the first opening having a first width, and simultaneously with etching the first opening, etching a second opening that extends at least partially through the substrate, the second opening have a second width greater than the first width. The method also includes simultaneously forming a first conductive via in the first opening and a second conductive via in the second opening.

In yet other aspects, embodiments described herein may provide for a device comprising a substrate and anan interconnect structure over the substrate. The interconnect structure comprises a plurality of low-k dielectric layers, and a plurality of metallization layers in the plurality of low-k dielectric layers and comprising metal pads, wherein the metal pads comprises copper, and a dielectric layer over the plurality of metallization layers, wherein a k value of the dielectric layer is higher than k values of the plurality of low-k dielectric layers. The device further includes a through-substrate via (TSV) extending from a top surface of the dielectric layer to a bottom surface of the substrate, a first deep conductive via extending from the top surface of the dielectric layer to land on a first metal pad in a first one of the plurality of metallization layers, and a second deep conductive via extending from the top surface of the dielectric layer to land on a second metal pad in a second one of the plurality of metallization layers different from the first one. A metal line is over the dielectric layer and electrically couples the TSV to the first and the second deep conductive vias.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method of manufacturing a device, the method comprising:
    forming a dielectric structure comprising a plurality of metallization layers including at least a bottom metallization layer and a top metallization layer, the plurality of metallization layers each formed in a respective one of a plurality of dielectric layers;
    forming a passivation layer over the top metallization layer of the dielectric structure;
    etching a first opening in the passivation layer and the dielectric structure, wherein the first opening exposes a metal pad disposed in one of the plurality of dielectric layers;
    etching a second opening through the passivation layer and the dielectric structure and into a portion of a substrate disposed below the dielectric structure, wherein the etching the first opening and the etching the second opening occur simultaneously;
    lining a top surface of the passivation layer and sidewalls and a bottom surface of each of the first opening and the second opening with an insulation layer;
    removing portions of the insulation layer along the bottom surface of the first opening to expose the metal pad;
    after removing the portions of the insulation layer, forming a diffusion barrier layer over the top surface of the passivation layer and along the sidewalls and the bottom surface of each of the first opening and the second opening; and
    simultaneously filling the first opening and the second opening with a conductive material, an uppermost surface of the conductive material extending above an uppermost surface of the passivation layer.

2. The method of claim 1, further comprising grinding a backside of the substrate to expose the conductive material within the second opening.

3. The method of claim 1, further comprising forming a conductive line interconnecting the conductive material within the first opening and the conductive material within the second opening, a bottom surface of the conductive line in contact with horizontal portions of the diffusion barrier layer over the passivation layer.

4. The method of claim 3, wherein the conductive line is formed in a same step as the step of simultaneously filling the first opening and the second opening.

5. The method of claim 1, further comprising:
overfilling the first opening and the second opening with the conductive material; and
planarizing the overfilled conductive material to form a first conductive via in the first opening and a second conductive via in the second opening.

6. The method of claim 5, further comprising:
forming a trench in a dielectric material above the conductive material within the first opening and the conductive material within the second opening;
lining the trench with a barrier material; and
filling the trench with a second conductive material.

7. The method of claim 6, wherein the second conductive material is a same material as the conductive material.

8. The method of claim 1, wherein the first opening has a first width, when viewed in cross section, and the second opening has a second width, when viewed in cross section, and the second width is wider than the first width.

9. The method of claim 8, wherein the first width is preselected and the second width is preselected such that the first opening extends a first depth and the second opening extends a second depth, greater than the first depth during a common etch process.

10. A method of manufacturing a device, the method comprising:
forming an interconnect structure over a substrate, the interconnect structure including a plurality of conductive pads formed in respective dielectric layers of a plurality of dielectric layers;
forming a passivation layer over the interconnect structure;
etching a first opening aligned with a first conductive pad, the first opening having a first width;
simultaneously with etching the first opening, etching a second opening that extends at least partially through the substrate, the second opening have a second width greater than the first width; and
simultaneously forming a first conductive via in the first opening and a second conductive via in the second opening, topmost surfaces of the first conductive via and the second conductive via extending above a topmost surface of the passivation layer.

11. The method of claim 10, wherein the first width and the second width are preselected such that the first opening extends to the first conductive pad at substantially the same time the second opening extends to at least partially through the substrate using the same process parameters.

12. The method of claim 10, wherein simultaneously forming a first conductive via in the first opening and a second conductive via in the second opening includes:
lining the topmost surface of the passivation layer and sidewalls of the first opening and the second opening with an insulating layer;
lining the topmost surface of the passivation layer and the sidewalls of the first opening and the second opening with a diffusion barrier layer; and
filling the lined first opening and the lined second opening with a conductive material to form the first conductive via and the second conductive via, respectively.

13. The method of claim 12, further comprising forming an interconnection between the first conductive via and the second conductive via.

14. The method of claim 13, wherein forming an interconnection comprises:
forming a trench in a dielectric material above the conductive material within the first opening and the conductive material within the second opening;
lining the trench with a barrier material; and
filling the trench with a second conductive material.

15. The method of claim 10, further comprising simultaneously with etching the first opening and the second opening, etching a third opening aligned with a second conductive pad, the second conductive pad being in a different dielectric layer than the first conductive pad, the third opening having a third width less than the first width.

16. The method of claim 10, further comprising:
overfilling the first opening and the second opening with a conductive material; and
planarizing the overfilled conductive material to form the first conductive via in the first opening and the second conductive via in the second opening.

17. A method of manufacturing a device, the method comprising:
forming an interconnect structure over a substrate, the interconnect structure comprising:
a plurality of low-k dielectric layers;
a plurality of metallization layers in the plurality of low-k dielectric layers and comprising metal pads, the plurality of metallization layers including a bottom metallization layer and a top metallization layer; and
a dielectric layer over the top metallization layer;
etching a first opening having a first width, the first opening extending from a top surface of the dielectric layer to a bottom surface within the substrate;
simultaneously with etching the first opening, etching a second opening having a second width, the second opening extending from the top surface of the dielectric layer to a first metal pad in a first one of the plurality of metallization layers; and
simultaneously filling the first opening and the second opening with a conductive material to form a through substrate via (TSV) in the first opening and a deep conductive via in the second opening, uppermost surfaces of the TSV and the deep conductive via extending above the top surface of the dielectric layer.

18. The method of claim 17, further comprising, simultaneously with etching the first opening and the second opening, etching a third opening having a third width, the third opening extending from the top surface of the dielectric layer to a second metal pad in a second one of the plurality of metallization layers different from the first one.

19. The method of claim 17, further comprising forming a conductive line interconnecting the TSV and the deep conductive via, wherein forming the conductive line is performed in a same process step as simultaneously filling the first opening and the second opening with the conductive material.

20. The method of claim 17, wherein a ratio of the first width of the first opening to the second width of the second opening is greater than about 1.5.

* * * * *